(12) United States Patent
Sugiura et al.

(10) Patent No.: US 7,559,139 B2
(45) Date of Patent: Jul. 14, 2009

(54) METHOD FOR MANUFACTURING A PROBE UNIT

(75) Inventors: Masahiro Sugiura, Hamamatsu (JP);
Kunio Hiyama, Hamamatsu (JP);
Susumu Ogino, Iwata (JP)

(73) Assignee: Yamaha Corporation, Shizuoka-Ken (JP)

( * ) Notice: Subject to any disclaimer, the term of this patent is extended or adjusted under 35 U.S.C. 154(b) by 0 days.

(21) Appl. No.: 11/970,704

(22) Filed: Jan. 8, 2008

(65) Prior Publication Data
US 2008/0115354 A1    May 22, 2008

Related U.S. Application Data

(62) Division of application No. 11/168,319, filed on Jun. 29, 2005, now abandoned.

(30) Foreign Application Priority Data

Jun. 29, 2004  (JP) .............................. 2004-190963

(51) Int. Cl.
*H05K 3/02* (2006.01)
*H05K 3/10* (2006.01)

(52) U.S. Cl. .......................... 29/846; 29/592.1; 29/825; 29/829; 29/847; 257/739; 257/773; 257/776; 257/E23.021; 324/756; 324/762

(58) Field of Classification Search .................. 29/846, 29/592.1, 825, 829, 847; 257/739, 773, 776; 257/E23.021; 324/754, 762
See application file for complete search history.

(56) References Cited

U.S. PATENT DOCUMENTS

| 6,011,261 | A | 1/2000 | Ikeda et al. |
| 6,111,418 | A | 8/2000 | Okuno et al. |
| 6,245,444 | B1 | 6/2001 | Marcus et al. |
| 6,466,042 | B1 | 10/2002 | Nan |
| 6,680,536 | B2 * | 1/2004 | Hattori et al. ............ 257/739 |
| 6,788,086 | B2 | 9/2004 | Hantschel et al. |
| 6,809,539 | B2 | 10/2004 | Wada et al. |
| 6,827,584 | B2 | 12/2004 | Mathieu et al. |
| 7,082,684 | B2 | 8/2006 | Hantschel et al. |
| 7,238,031 | B2 | 7/2007 | Takai |
| 7,247,035 | B2 | 7/2007 | Mok et al. |
| 2003/0010615 | A1 | 1/2003 | Fork et al. |

FOREIGN PATENT DOCUMENTS

| JP | 8-240631 A | 9/1996 |
| JP | 2002-286755 | 10/2002 |
| JP | 2003-057266 | 2/2003 |
| JP | 2003-185676 A | 7/2003 |

* cited by examiner

*Primary Examiner*—Thiem Phan
(74) *Attorney, Agent, or Firm*—Dickstein Shapiro LLP

(57) ABSTRACT

A method for manufacturing a probe unit includes: (a) preparing a substrate; (b) forming a hollow part in the substrate; (c) forming a sacrificial layer that buries the hollow part on the substrate; (d) forming a first layer on the substrate, wherein one end of the first layer is positioned on the sacrificial layer; (e) forming a second layer on the first layer at least excepting the one end; and (f) removing the sacrificial layer.

5 Claims, 18 Drawing Sheets

FIG.7A1
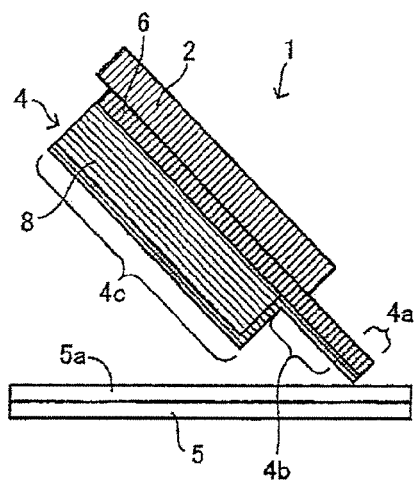
FIG.7B1
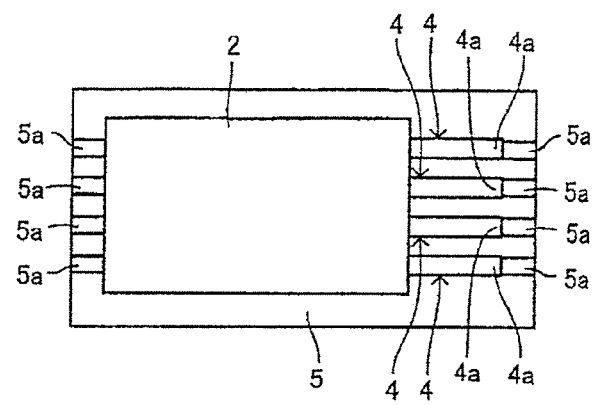
FIG.7A2
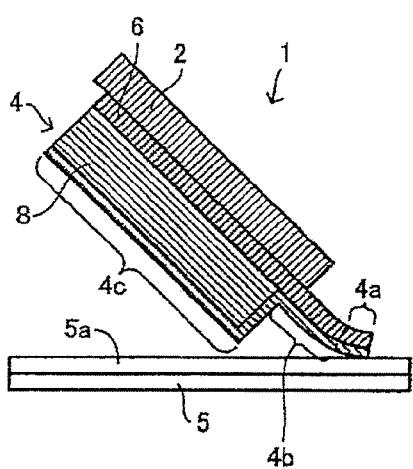
FIG.7B2
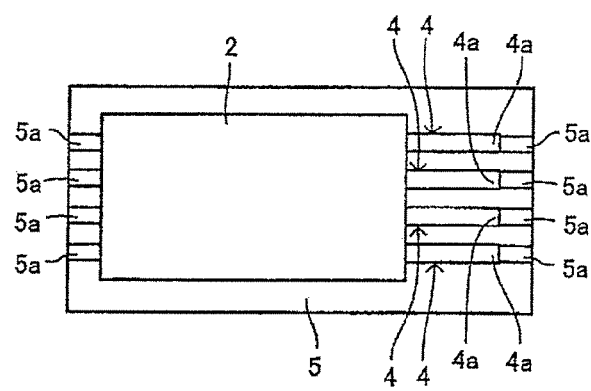

FIG.14A1
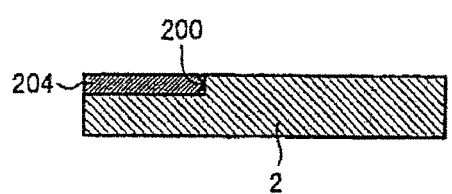
FIG.14A2
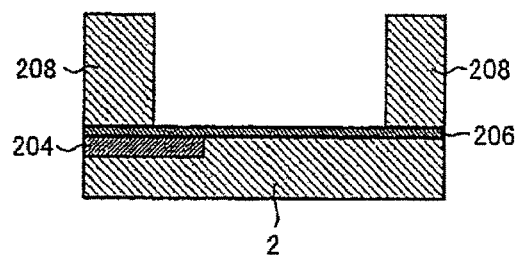
FIG.14A3
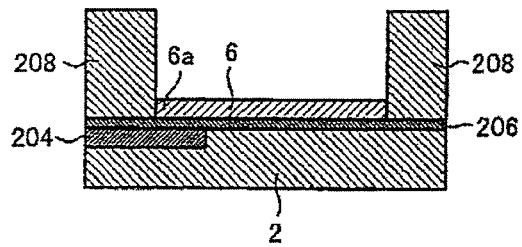
FIG.14A4
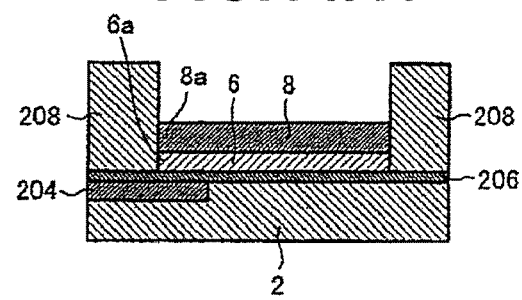
FIG.14A5
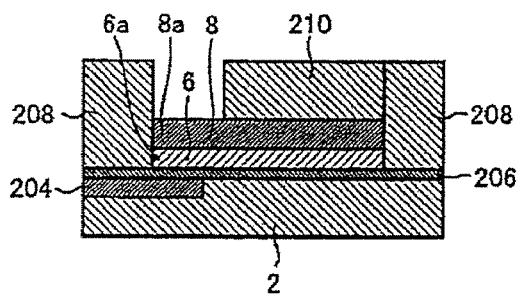
FIG.14A6
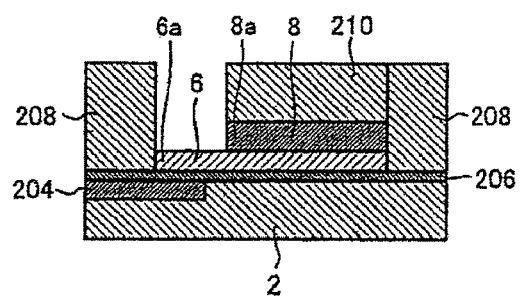
FIG.14A7
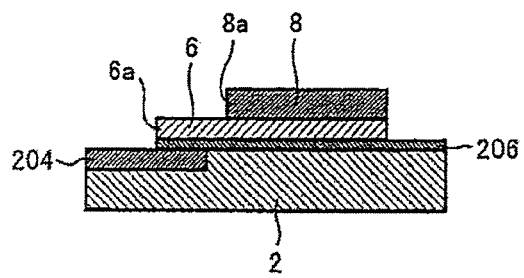

FIG.15A8
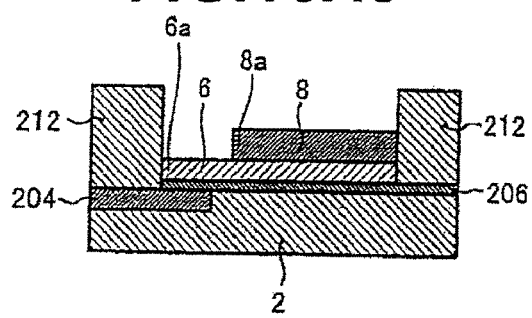
FIG.15A9
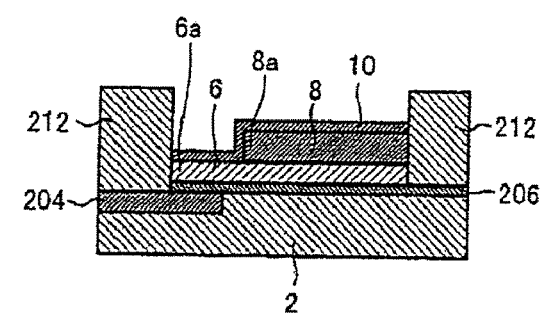
FIG.15A10
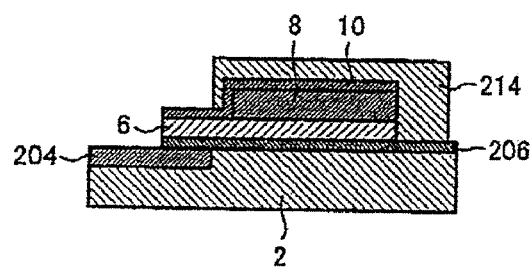
FIG.15A11
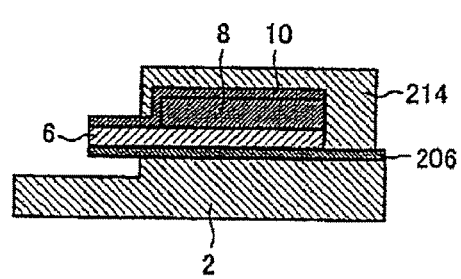
FIG.15A12
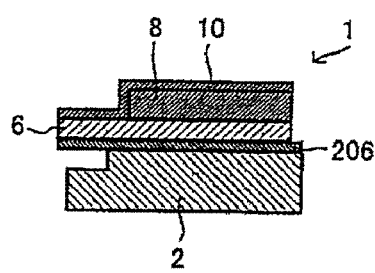

FIG.16A1
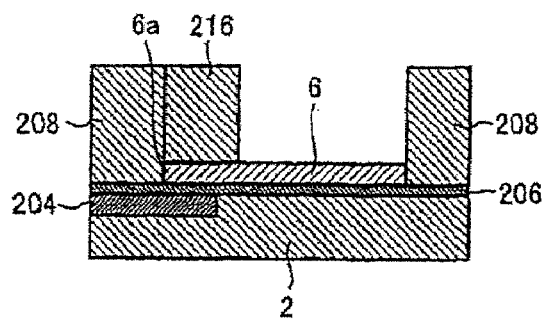
FIG.16A2
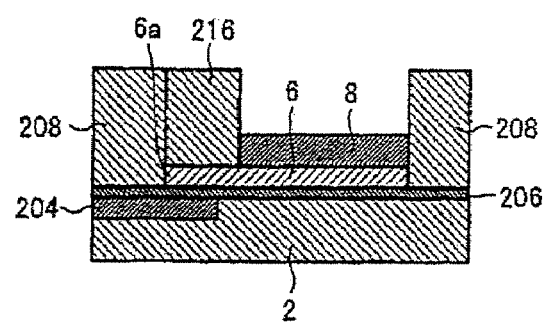
FIG.16A3
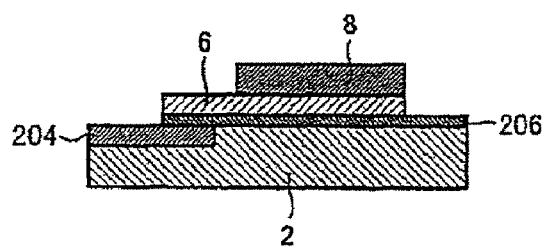

FIG.17A1
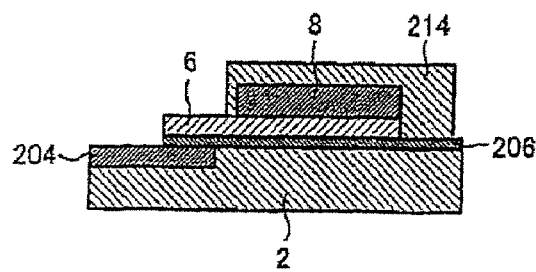
FIG.17A2
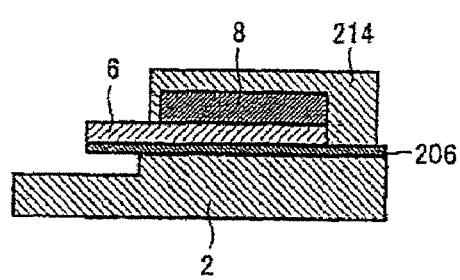
FIG.17A3
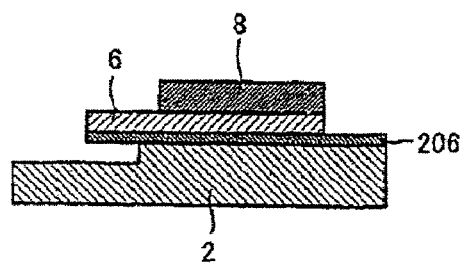
FIG.17A4
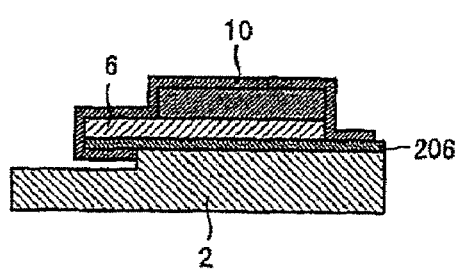
FIG.17A5
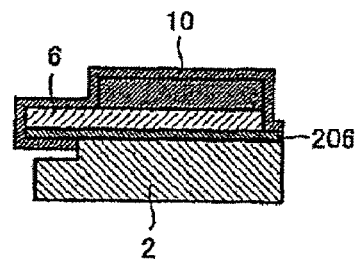

FIG.18A1
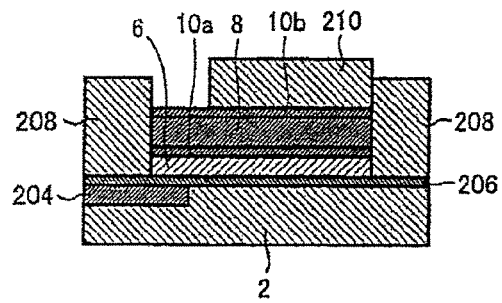
FIG.18A2
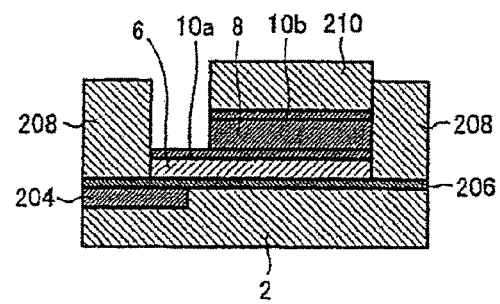
FIG.18A3
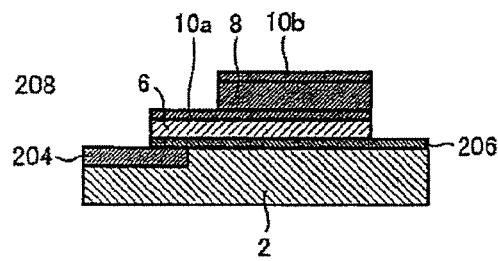
FIG.19A1
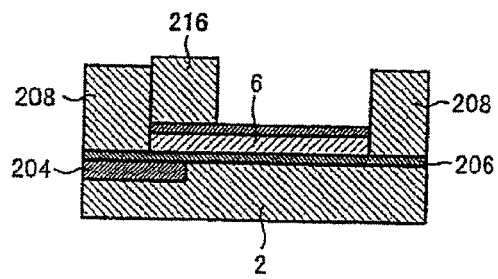
FIG.19A2
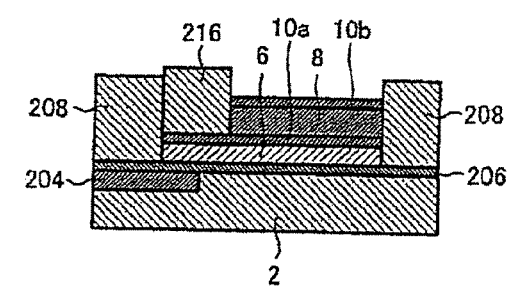
FIG.19A3
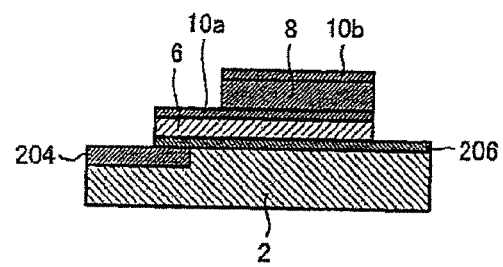

FIG.20A1
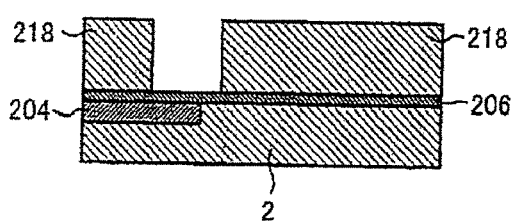
FIG.20A2
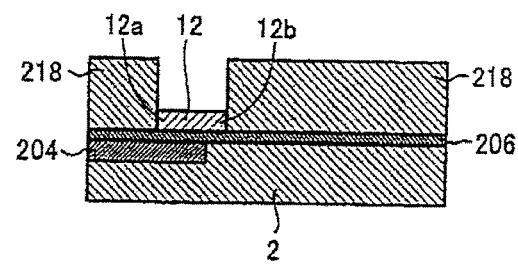
FIG.20A3
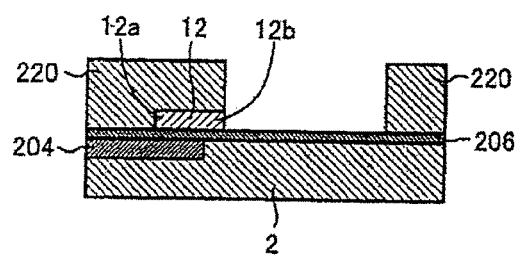
FIG.20A4
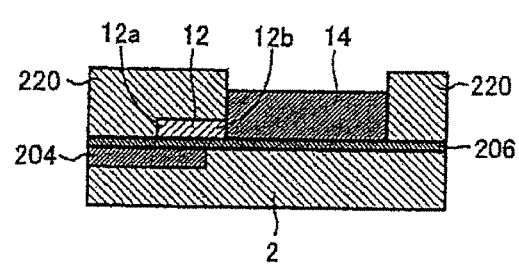
FIG.20A5
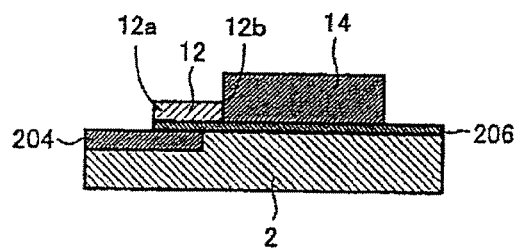

FIG.21A1
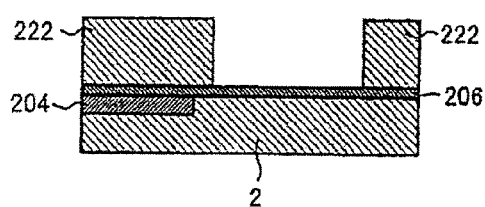
FIG.21A2
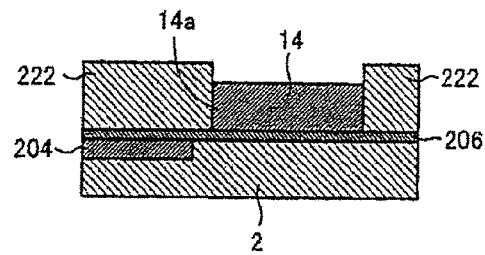
FIG.21A3
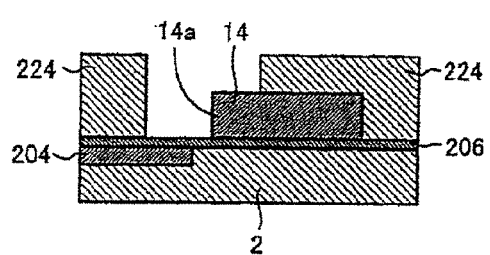
FIG.21A4
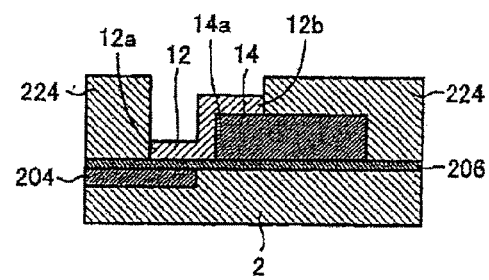
FIG.21A5
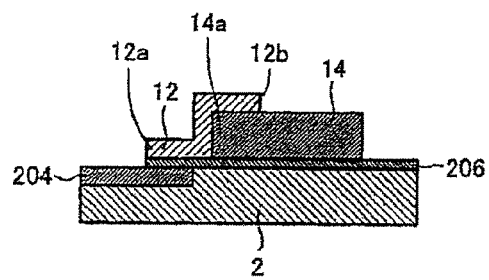

FIG.22A1
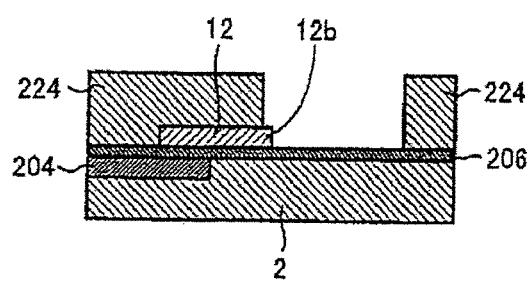
FIG.22A2
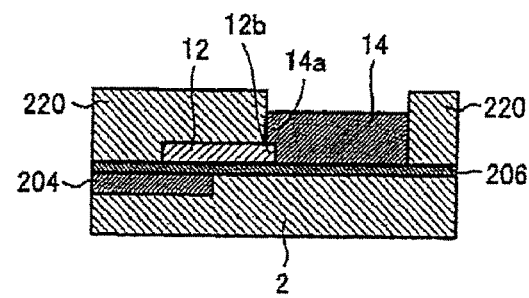
FIG.22A3
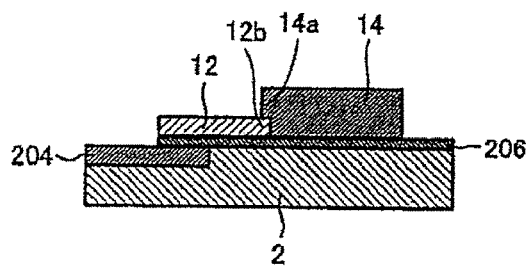

FIG.23A1
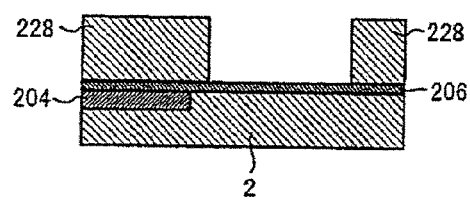
FIG.23A2
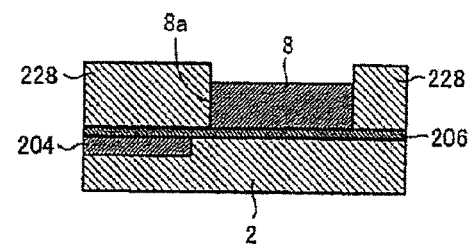
FIG.23A3
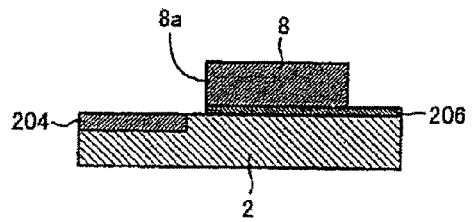
FIG.23A4
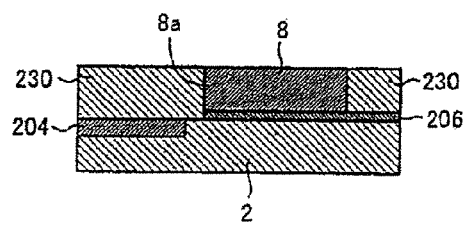
FIG.23A5
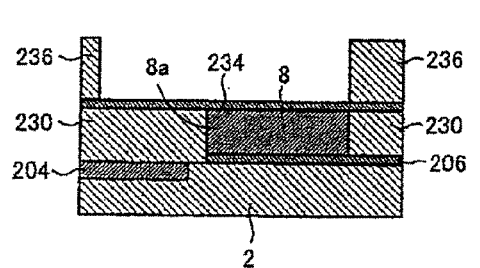
FIG.23A6
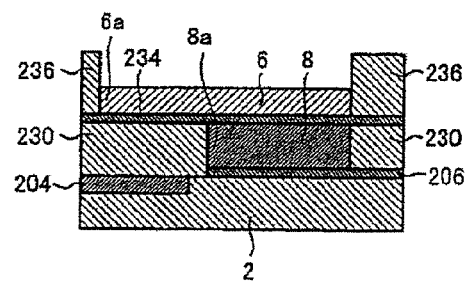
FIG.23A7
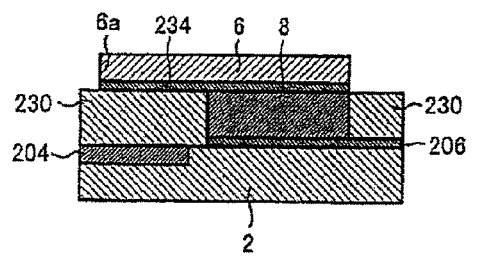
FIG.23A8
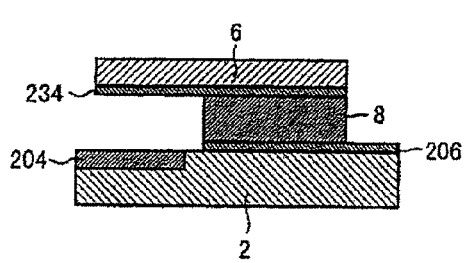

METHOD FOR MANUFACTURING A PROBE UNIT

CROSS REFERENCE TO RELATED APPLICATION

This is a division of application Ser. No. 11/168,319, filed Jun. 29, 2005, which is based on Japanese Patent Application 2004-190963, filed on Jun. 29, 2004, the entire contents of each of which are incorporated herein by reference.

BACKGROUND OF THE INVENTION

A) Field of the Invention

The present invention relates to a probe unit and a manufacturing method thereof.

B) Description of the Related Art

Conventionally a probe unit having a plurality of leads projecting from a substrate and contacting with electrodes of a sample is known. In a probe unit disclosed in Japanese Laid-open Patent No. 2002-286755 (hereinafter called the Patent Document 1), tips of leads and their peripheral areas are bent by overdrive because the leads are projecting from a substrate. Therefore, the tips of the leads and the electrodes of the sample can be conducted firmly with a proper contacting pressure.

In the conventional probe unit as disclosed in the Patent Document 1, thicknesses of the leads are uniformed. Moreover, material for the leads and the thicknesses of the leads are designed in accordance with durability of the projection parts of the leads from the substrate and the above-described contacting pressure. Therefore, it is not easy for the probe unit according to the Patent Document 1 to be designed to have low electric resistance by forming the leads with material having low electric resistance and by making the thicknesses thick. In addition to that, widths of the leads are designed in accordance with a pitch of the electrodes of the sample. Therefore, narrowing the widths of the leads cannot lower the electric resistance of the leads. In this type of the probe unit, a frequency range that can be used in a continuity test will be narrow because of a high conductor loss.

On the other hand, Japanese Laid-open Patent No. 2003-57266 discloses a probe unit wherein leads are formed on a film, tips of the leads are projecting from the film, and the tips and the middle parts of the leads are made of different materials. In the probe unit according to the Patent Document 2, middle parts of the leads can be made of material having lower electrical resistance than their tips. That is, the frequency range of a signal that can be used in a continuity test can be widened by lowering conductor losses because the electrical resistance of the leads can be lowered.

However, the probe unit according to the Patent Document 2 is manufactured by forming leads on a supporting metal plate, contacting parts of the leads that are not projecting from a film with the film by adhesive, and separating the supporting metal plate. The leads on the supporting metal plate side will be plane because they are formed on the supporting metal plate. Moreover, the adhesive contacts the leads and the film; therefore, large steps cannot be formed on the film side of the leads. That is, widths of the leads in the probe unit according to the Patent Document 2 cannot be designed freely to lower the electrical resistance of the leads.

SUMMARY OF THE INVENTION

It is an object of the present invention to provide a probe unit and its manufacturing method which can make continuity with a sample firmly with a proper contact pressure while lowering electrical resistance of leads.

According to one aspect of the present invention, there is provided a probe unit, comprising: a substrate; and a lead formed on the substrate and having a tip part projecting from an edge of the substrate and contacting to an electrode of a sample, and a thick part of which thickness is thicker than the tip part.

BRIEF DESCRIPTION OF THE DRAWINGS

FIG. 7A1 to FIG. 7B2 are schematic diagrams showing a continuity test by the probe of the probe unit according to the first embodiment of the probe unit of the present invention.

FIG. 14 are schematic diagrams for explaining a manufacturing method according to a first embodiment of the method for manufacturing the probe unit of the present invention.

FIG. 15 are schematic diagrams for explaining a manufacturing method according to the first embodiment of the method for manufacturing the probe unit of the present invention.

FIG. 16 are schematic diagrams for explaining a manufacturing method according to a second embodiment of the method for manufacturing the probe unit of the present invention.

FIG. 17 are schematic diagrams for explaining a manufacturing method according to a third embodiment of the method for manufacturing the probe unit of the present invention.

FIG. 18 are schematic diagrams for explaining a manufacturing method according to a fourth embodiment of the method for manufacturing the probe unit of the present invention.

FIG. 19 are schematic diagrams for explaining a manufacturing method according to a fifth embodiment of the method for manufacturing the probe unit of the present invention.

FIG. 20 are schematic diagrams for explaining a manufacturing method according to a sixth embodiment of the method for manufacturing the probe unit of the present invention.

FIG. 21 are schematic diagrams for explaining a manufacturing method according to a seventh embodiment of the method for manufacturing the probe unit of the present invention.

FIG. 22 are schematic diagrams for explaining a manufacturing method according to the seventh embodiment of the method for manufacturing the probe unit of the present invention.

FIG. 23 are schematic diagrams for explaining a manufacturing method according to an eighth embodiment of the method for manufacturing the probe unit of the present invention.

DETAILED DESCRIPTION OF THE PREFERRED EMBODIMENTS

Figure 1A:
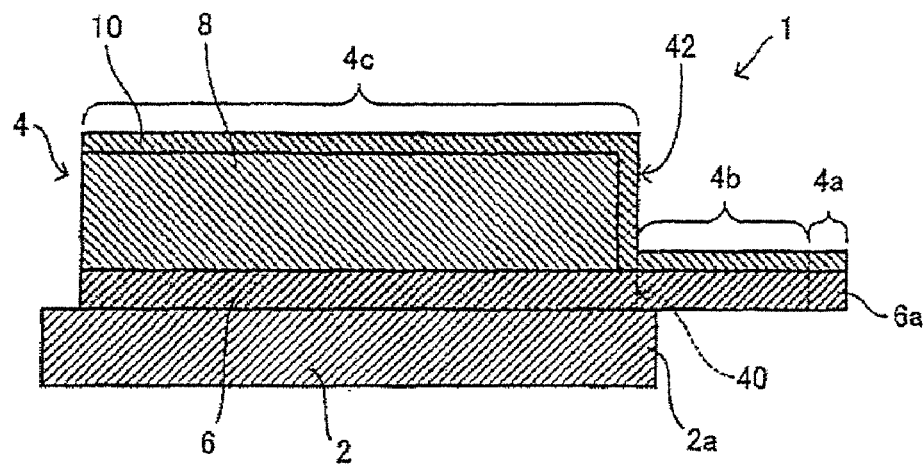
FIG. 1A is a cross sectional view showing a probe cut in line X1-X1 in FIG. 1B according to a first embodiment of a probe unit of the present invention.
Figure 1B:
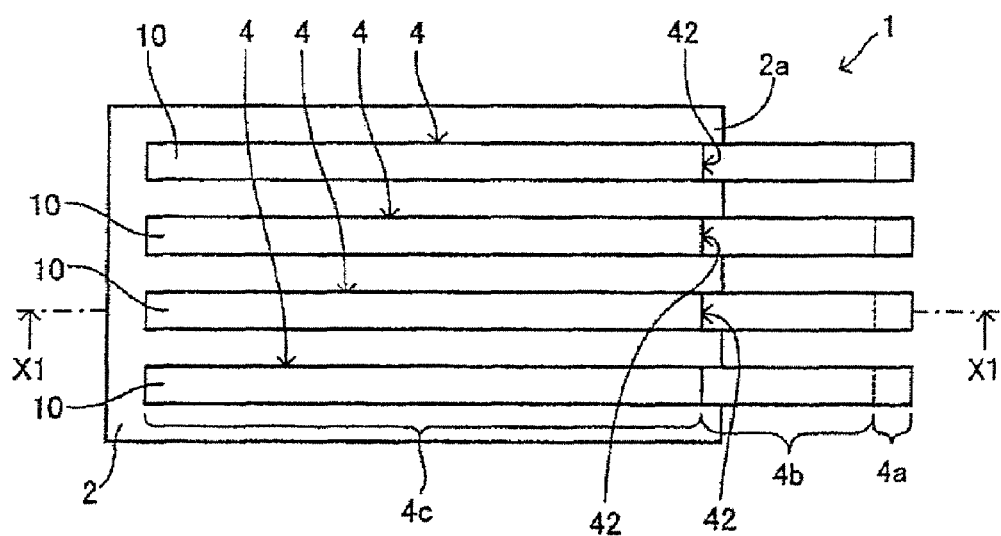
FIG. 1B is a plan view showing the probe.

FIGS. 1A and 1B are schematic diagram showing a structure of a probe unit 1 according to a first embodiment of a probe unit of the present invention. The probe unit 1 is used for testing an electrical property of a sample 5 such as a liquid crystal panel, an integrated circuit (IC), etc. by electrically contacting probes 4 with electrodes 5a of the sample 5 (refer to FIG. 7). The probe unit 1 has thin parts 4b designed in accordance with a contact pressure with the electrodes 5a of the sample 5 at a time of later-described overdrive and thick parts 4c designed in accordance with electric resistance of the probes 4. Therefore, the probe unit 1 can electrically contact the probes 4 with the electrodes 5a of the sample 5 at a proper contact pressure, and the electrical resistance of the probes 4 can be lowered.

A substrate 2 is made of ceramic and formed in a shape of a plate. The substrate 2 may be made of non-organic material such as glass ceramic, glass, silicon and metal or resin.

The plurality of probes 4 are formed on the substrate 2. Each one of the probes 4 as leads has a tip 4a, the thin part 4b and the thick part 4c. The tip 4a is projecting from an edge 2a of the substrate 2. The thin part 4b is formed between the tip 4a and the thick part 4c. The thin part 4b is formed to have the same thickness as the tip 4, and the thick part 4c is thicker than the tip 4a and the thin part 4b. Although in this embodiment, a boundary 40 between the thin part 4b and the thick part 4c is positioned on the substrate 2, and a step (difference in levels) 42 between the thin part 4b and the thick part 4c is formed on a surface of the probe 4 on the opposite side of the substrate 2, an outline shape of the probe unit 1 is not limited to that. For example, the boundary 40 between the thin part 4b and the thick part 4c may not be positioned on the substrate 2 as in the later-described probe unit 161 according to a second embodiment (refer to FIG. 9), or a slope 42 may be formed on the surface of the probe 4 on the substrate 2 side as a probe unit 111 shown in FIG. 2.

The probe 4 has a first layer 6, a second layer 8 and a surface layer 10. The first layer as a lower layer of the tip 4a, the thin part 4b and the thick part 4c is formed on the substrate 2. An edge 6a of the first layer 6 as the tip 4a is projecting from the edge 2a of the substrate 2. The part of the first layer 6 projecting from the edge 2a of the substrate 2 will bend in a condition that the tip 4a of the probe 4 contacts with the electrode 5a of the sample 5 by the later-described overdrive (refer to FIG. 7). Therefore, material and thickness of the first layer 6 is designed preferably in accordance with a contact pressure between the tip 4a and the electrode 5a of the sample 5 by the overdrive and its durability.

Table 1 shows a result of an experiment testing a relationship between a contact pressure (W) and stress (□) for each overdrive distance (OD). The experiment used the first layer 6 having width (B) of 50 □m, of which the part projecting from the edge 2a of the substrate 2 is set to have length (L) of 1.2 mm. Young's modulus (E) of NiFe is 21414 kgf/mm$^2$, and the yield point strength is 130 kgf/mm$^2$.

TABLE 1

| L<br>mm | B<br>□m | E<br>kgf/mm$^2$ | T<br>mm | OD<br>mm | W<br>gf | □<br>kgf/mm$^2$ |
|---|---|---|---|---|---|---|
| 1.2 | 50 | 21414 | 0.02 | 0.05 | 0.062 | 22.306 |
| 1.2 | 50 | 21414 | 0.02 | 0.10 | 0.124 | 44.613 |
| 1.2 | 50 | 21414 | 0.02 | 0.15 | 0.186 | 66.919 |
| 1.2 | 50 | 21414 | 0.02 | 0.20 | 0.248 | 89.225 |
| 1.2 | 50 | 21414 | 0.03 | 0.05 | 0.209 | 33.459 |
| 1.2 | 50 | 21414 | 0.03 | 0.10 | 0.418 | 66.919 |
| 1.2 | 50 | 21414 | 0.03 | 0.15 | 0.627 | 100.378 |
| 1.2 | 50 | 21414 | 0.03 | 0.20 | 0.836 | 133.838 |

According to the result, the stress (□) is smaller than the yield point strength when the overdrive distance (OD) is in a range from 0.05 mm to 0.2 mm in the first layer 6 with the thickness (T) of 0.02 mm. For example, the stress (□) is 89.225 kgf/mm$^2$ and smaller than the yield point strength of 130 kgf/mm$^2$ when the overdrive distance (OD) is 0.2 mm. On the other hand, in the first layer 6 with the thickness (T) of 0.03 mm, the stress (□) is 133.838 kgf/mm$^2$ and larger than the yield point strength of 130 kgf/mm$^2$ when the overdrive distance (OD) is 0.2 mm. That is, the first layer 6 of the probe unit 1 will be made of NiFe and designed to have the thickness of 0.02 mm and the width of 50 □m, and the length of the part projecting from the edge 2a of the substrate 2 is designed to 1.2 mm. Further, material for forming the first layer 6 is not limited to NiFe. For example, the material for forming the first layer 6 may be Ni alloy such as NiCo, NiMn, etc. or Ni.

The second layer 8 is formed on the first layer 6. The second layer 8 as an upper layer of the thick part 4c will not bent by the overdrive. Therefore, material and thickness of the second layer 8 is preferably designed in accordance with electrical resistance of the probe 4. For example, the second layer 8 is formed of Cu. Moreover, the second layer 8 is preferably formed of material having electrical resistance lower than that of the material used for the first layer 6, but the material is not limited to Cu. For example, the material for the second layer 8 may be the same material as for the first layer 6, i.e., NiFe, or may be Ni alloy such as NiMn, etc., or Ni, Au, Al, etc.

The surface layer 10 is formed of Au on the first layer 6 and on the second layer 8. Further, the surface layer 10 is preferably formed of material having lower electric resistance, but it is not limited to Au. For example, the material for the surface layer 10 may be Au alloy, Pd, Rh, Ir, etc. The shape and the position of the surface layer 10 is not limited to those shown in FIG. 1. For example, the surface layer 10 covering the surfaces of the first layer 6 and the second layer 8 as in a probe unit 121 shown in FIG. 4. Moreover, a first surface layer 10a and a second surface layer 10b may be formed respectively on the first layer 6 and the second layer 8 as in a probe unit 131 shown in FIG. 5, or the surface layer 10 may be formed on either one of the first layer 6 and the second layer 8. Furthermore, as long as satisfying a specification of testing the sample 5, a surface layer may be omitted as in a probe unit 141 shown in FIG. 6.

Table 2 shows relationships between thickness (T1) of the first layer 6, thickness (T2) of the second layer 8 and thickness (T3) of the surface layer 10 and electrical resistance (R) of probes A to C. The probes' width is 50 μm, length of the part (projection) projecting from the edge 2a of the substrate 2 is 1.2 mm, and length of a part (wiring) formed on the substrate 2 is 3.0 mm. Electrical resistance (R1) of the first layer 6 formed of NiFe is calculated by assuming that resistivity of NiFe is 20 μΩcm. Electrical resistance (R2) of the second layer 8 formed of Cu is calculated by assuming that resistivity of Cu is 2 μΩcm. Electrical resistance (R3) of the surface layer 10 formed of Au is calculated by assuming that resistivity of Au is 3 μΩcm. Further, the layer having the thickness of "0" means that the probe does not have the layer. R4 represents resistance of each of the projection and the wiring.

TABLE 2

|  | PROBE A | | PROBE B | | PROBE C | |
| --- | --- | --- | --- | --- | --- | --- |
|  | PROJECT. | WIRING | PROJECT. | WIRING | PROJECT. | WIRING |
| T1 (μm) | 20 | 20 | 20 | 20 | 20 | 20 |
| T2 (μm) | 0 | 0 | 0 | 40 | 0 | 40 |
| T3 (μm) | 0 | 0 | 0 | 0 | 3 | 3 |
| R1 (Ω) | 0.240 | 0.600 | 0.240 | 0.600 | 0.240 | 0.600 |
| R2 (Ω) |  |  |  | 0.030 |  | 0.030 |
| R3 (Ω) |  |  |  |  | 0.240 | 0.600 |
| R4 (Ω) | 0.240 | 0.600 | 0.240 | 0.029 | 0.120 | 0.027 |
| R (Ω) | 0.840 | | 0.269 | | 0.147 | |

According to the result shown in TABLE 2, the probe C having the second layer 8 and the surface layer 10 can lower the electric resistance by 0.693Ω comparing to the probe A without the second layer and the surface layer. The probe B having the second layer 8 without the surface layer 10 can lower the electric resistance by 0.571Ω comparing to the probe A without the second layer and the surface layer.

FIG. 7A1 to FIG. 7B2 are schematic diagram for explaining a testing method of an electric property of the sample 5 using the probe unit 1. The probes 4 are electrically continued with the electrodes 5a of the sample 5 by contacting each tip 4a of the probes 4 with each electrode 5a of the sample 5 one by one.

First, as shown in FIG. 7A1 and FIG. 7B1, the probe unit 1 is aligned toward the sample 5 so that each tip 4a of the probes 4 corresponds to each electrode 5a of the sample 5 one by one.

Figure 2A:
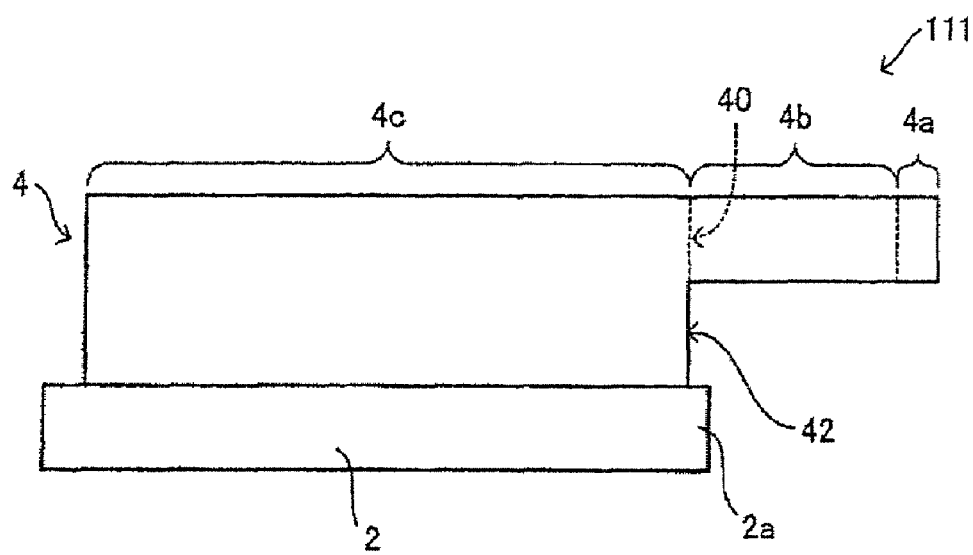
FIG. 2A is a side view of the probe according to the first embodiment of the probe unit of the present invention.
Figure 2B:
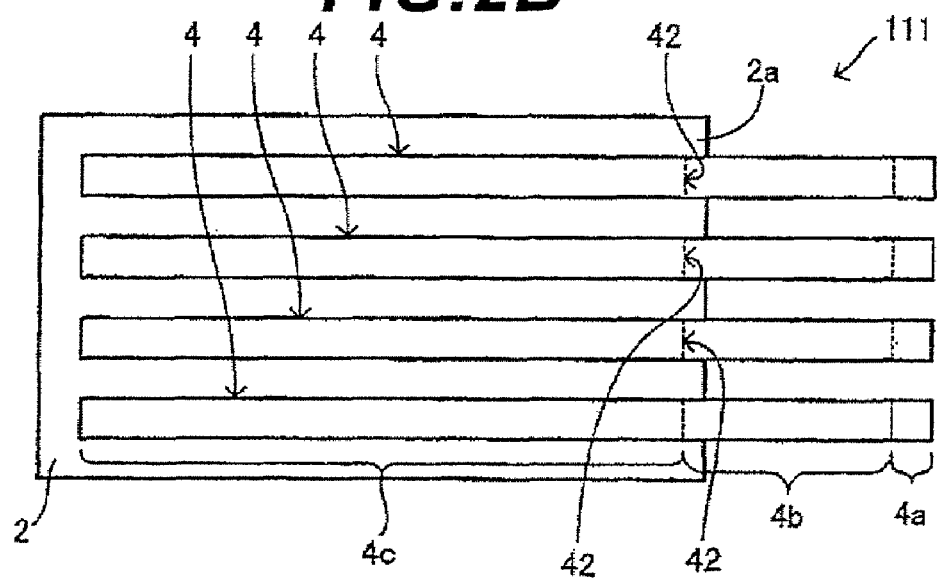
FIG. 2B is a plan view showing the probe.

Next, as shown in FIG. 7A2 and FIG. 7B2, the probe unit 1 is approached to the sample 5 so that the tips 4a of the probes 4 are contacted to the electrodes 5a. By further approaching the probe unit 1 to the sample 5, i.e., overdriven the probe unit 1, the tips 4a and parts of the thin parts 4b of the probes 4 are bent by the overdrive. At that time, the tips 4a of the probes 4 and the electrodes 5a of the sample 5 can be contacted at a proper contact pressure if the material and thickness of the first layer 6 are designed in accordance with the contact pressure of the overdrive.

Next, while the probes 4 and the electrodes 5a of the sample 5 are electrically continued, test signals are input from a testing device to the electrodes 5a via the probes 4 to test an electric property of the sample 5. At that time, if the electrical resistance of the probes 4 is low, the sample 5 can be tested by using the testing signal at a wide range of frequencies.

When the sample 5 and the probe unit 1 are separated after the test, the shape of the probes 4 will return to a condition before the test by their elasticity.

By the probe unit 1 according to the first embodiment of the probe unit of the present invention, the tips 4a of the probes 4 and the parts of the thin parts 4b are bent by the overdrive in the condition that the tips 4a are contacted to the electrodes 5a of the sample 5 because the tips 4a and the parts of the thin parts 4b of the probes 4 are projecting from the edge 2a of the substrate 2. Therefore, if the material and thickness of the first layer 6 are designed in accordance with the contact pressure of the overdrive, the tips 4a of the probes 4 and the electrodes 5a of the sample 5 can be contacted firmly at a proper contact pressure.

If the material and thickness of the first layer 6 are designed in accordance with the contact pressure of the overdrive, it is not easy to design the probes 4 to have small electric resistance. However, each of the thick part 4c of the probe unit 1 has the second layer 8. Therefore, thickness of the thick part 4c will be thickened by the thickness of the second layer 8. In addition to that, the material and thickness of the second layer 8 can be designed in accordance with the electrical resistance of the probes 4; therefore, the electrical resistance of the probes 4 can be lowered. That is, the conductor losses of the probes 4 can be deceased.

Moreover, each of the probes 4 has the surface layer 10 formed of Au having lower electrical resistance. Therefore, the electrical resistance of the probe 4 can be lowered. Especially, an electrical signal at a high frequency flows in the surface layer 10 near the surface of the probe 4 by the skin effect; therefore, conductor losses toward the high frequency signal can be effectively decreased.

Further, although the probe 4 has the first layer 6, the second layer 8 and the surface layer 10 in the above-described embodiment, the structure of the probe 4 is not limited to that. For example, as in a probe unit 151 shown in FIG. 8, the probes 4 may have a third layer as an upper layer of the thick part 4c.

Next, a second embodiment of a probe unit of the present invention will be explained. A probe unit 161 according to the second embodiment is different from the probe unit 1 according to the first embodiment in its shape of probes. The similar parts as in the first embodiment are marked with the same reference numbers as in the first embodiment and their explanation will be omitted.

Figure 9A:
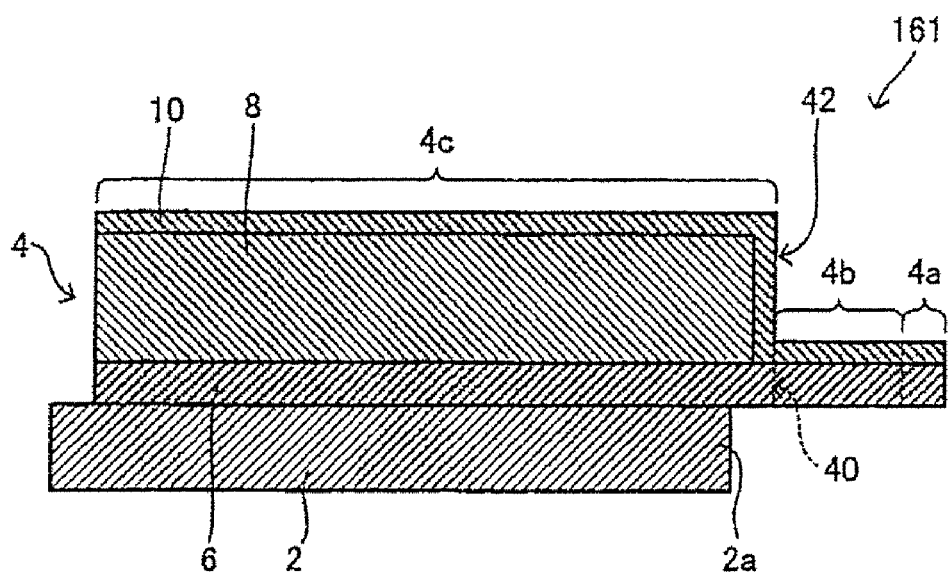
FIG. 9A is a cross sectional view showing a probe cut in line X2-X2 in FIG. 9B according to a second embodiment of the probe unit of the present invention.
Figure 9B:
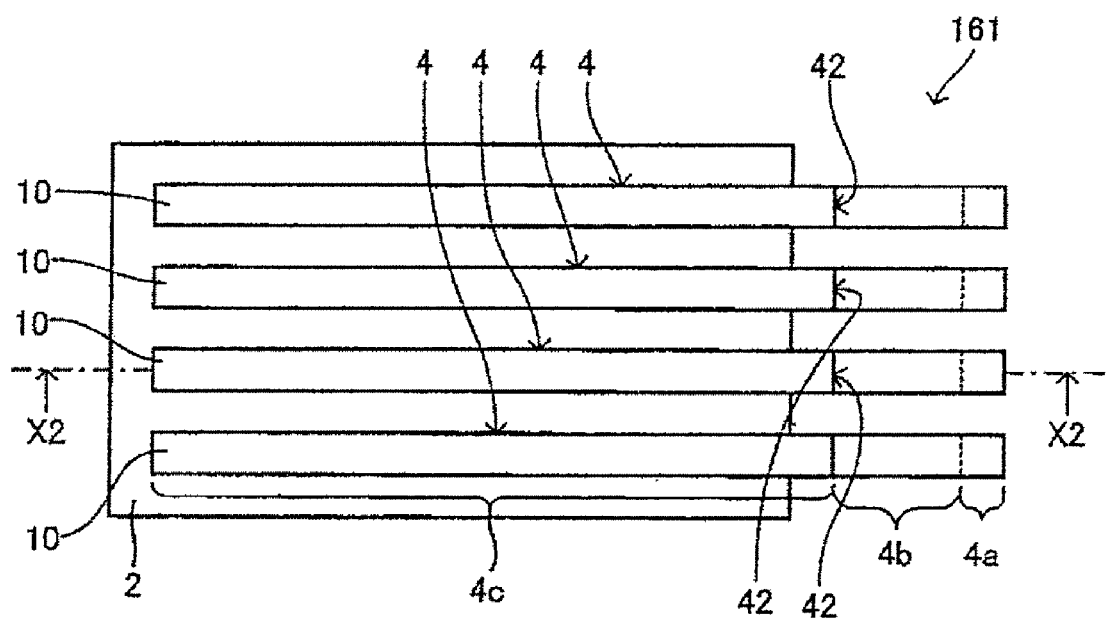
FIG. 9B is a plan view showing the probe.

FIG. 9A and FIG. 9B schematically show a structure of the probe unit 161 according to the second embodiment of the probe unit of the present invention. The thick part 4c of each probe 4 of the probe unit 161 is projecting from the edge 2a of the substrate 2. That is, the boundary between the thin part 4b and the thick part 4c is positioned in a part where the probe 4 is projecting from the edge 2a of the substrate 2. Although the second layer 8 and the surface layer 10 as the thick part 4c are projecting from the edge 2a of the substrate 2, the structure of the probe 4 is not limited to that. For example, only the surface layer 10 may be projecting from the edge 2a of the substrate 2, or only the second layer 8 may be projecting from the edge 2a of the substrate 2 in a probe unit without the surface layer 10 as in the probe unit 141.

Figure 10A:
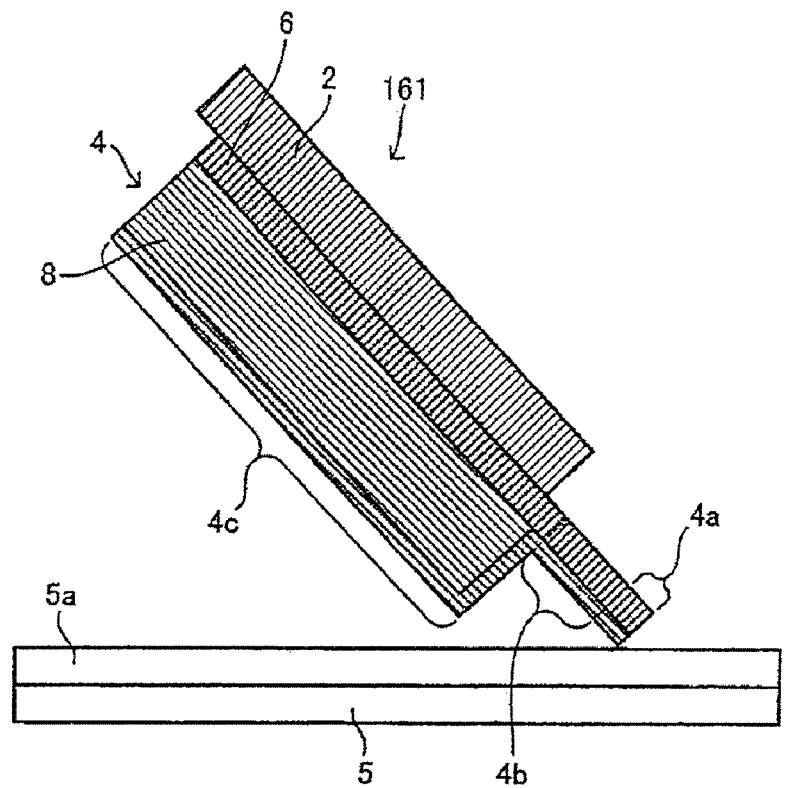
FIG. 10A and FIG. 10B are schematic diagrams showing a continuity test by the probe of the probe unit according to the second embodiment of the probe unit of the present invention.
Figure 10B:
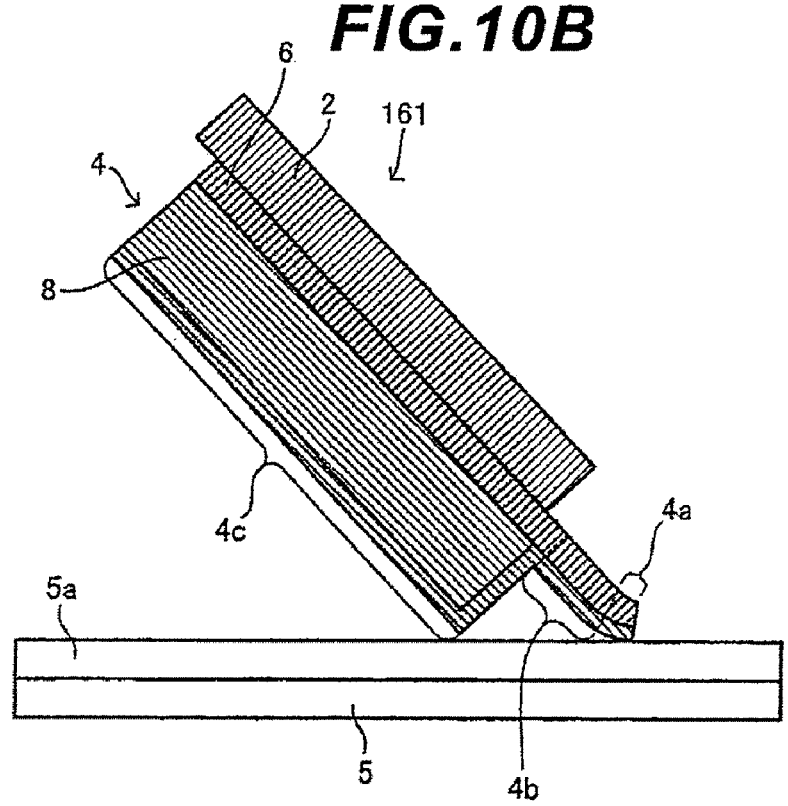

FIG. 10A and FIG. 10B are schematic diagrams showing conditions when the probe unit 161 is overdriven in a continuity test of the sample 5. The tips 4a and the thin parts 4 of the probes 4 are bent by the overdrive; however, the parts of the thick parts 4c projecting from the edge 2a of the substrate 2 are hardly bent by the overdrive. That is, bending near the edge 2a of the substrate 2 is small.

When the parts projecting from the edge 2a of the substrate 2 are bent by the overdrive, force in a direction to separate the probes 4 from the substrate 2 will be imposed on the probes 4. Especially, when the probes 4 near the edge 2a of the substrate 2 are bent, the force will be increased. However, the thick parts 4c are projecting from the edge 2a of the substrate 2 in the probe unit 161 according to the second embodiment of the probe unit of the present invention, bending of the probes 4 near the edge 2a of the substrate 2 is small. Therefore, the force in a direction to separate the probes 4 from the substrate 2 will be decreased, and the separation of the probes 4 from the substrate 2 can be avoided.

Next, a third embodiment of a probe unit of the present invention will be explained. A probe unit 171 according to the third embodiment is different from the probe unit 1 according to the first embodiment in its shape of probes. The similar parts as in the first embodiment are marked with the same reference numbers as in the first embodiment and their explanation will be omitted.

Figure 11:
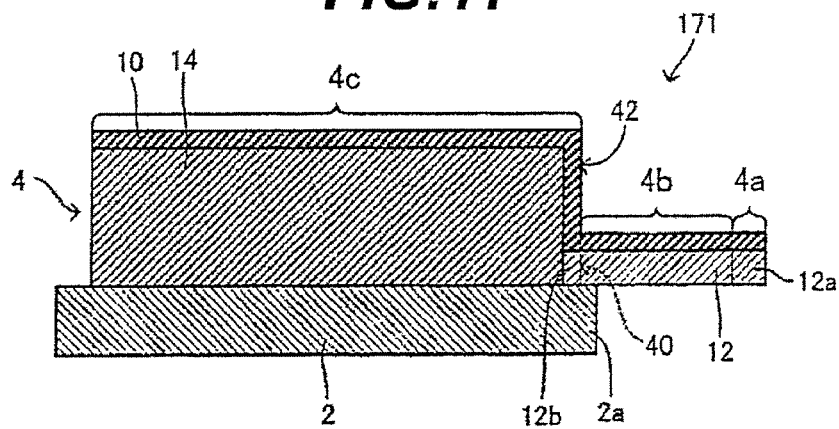
FIG. 11 is a schematic diagram of the probe of a probe unit according to a third embodiment of the probe unit of the present invention.

FIG. 11 schematically shows a structure of the probe unit 171 according to the third embodiment of the probe unit of the present invention.

Each thin layer 12 is formed of NiFe and on the substrate 2. One end 12a of the thin layer 12 as the tip 4a is projecting from the edge 2a of the substrate 2. Since the part projecting from the edge 2a of the substrate 2 is bent by the overdrive, material and thickness of the thin layer 12 are designed preferably in accordance with the contact pressure of the tips 4a and the electrodes 5a of the sample 5 at the time of the overdrive and their durability. Further, the material for the thin layer 12 is not limited to NiFe. For example, the material for the thin layer 12 may be Ni alloy such as NiCo, NiMn, etc. or Ni.

A thick layer 14 is formed of Cu to be thicker than the thin layer 12. The thick layer 14 is connected to another end 12b of the thin layer 12. Although it is preferable to form the thick layer 14 of the material having lower electrical resistance than that used for forming the thin layer 12, it is not limited to Cu. For example, the material for the thick layer 14 may be the same material used for forming the thin layer 12, Ni alloy such as NiCo, NiMn, etc, or Ni, Au, Al, etc. As in a probe unit 12 shown in FIG. 12, the another end 12b of the thin layer 12 may be buried in the thick layer 14. Moreover, as in a probe unit 191 shown in FIG. 13, the thin layer 12 may be formed to cover a part on the side of one end 14a of the thick layer 14.

By the probe unit 171 according to the third embodiment of the probe unit of the present invention, the thin layer 12 corresponding to the tips 4a and the thin parts 4b of the probes 4 are projecting from the edge 2a of the substrate 2. Therefore, if the material and thickness of the thin layer 12 are designed in accordance with the contact pressure between the tips 4a and the electrodes 5a of the sample 5 at the time of the overdrive, the tips 4a of the probes 4 and the electrodes 5a of the sample 5 can be contacted firmly at a proper contact pressure.

Moreover, since the thick layer 14 is formed thicker than the thin layer 12, the electrical resistance of the probes 4 can be decreased. Furthermore, if the material and thickness of the thick layer 14 are designed in accordance with the electrical resistance of the probes 4, the electrical resistance of the probes 4 can be further decreased.

Although the probe 4 has the surface layer 10 formed of the material having the lower electrical resistance (e.g., Au) in the above-described embodiment, the surface layer 10 may be formed on the surface of the tip 4a with material harder than the inside of the tip 4a. When the probe 4 is overdriven, the hard surface layer 10 is contacted with the electrode 5a of the sample 5; therefore, wearing down of the tip 4a of the probe 4 by the contact with the electrode 5a of the sample can be restrained.

Next, manufacturing methods of the probe units according to a plurality of embodiments will be explained.

FIGS. 14 and 15 are schematic diagrams for explaining a manufacturing method according to a first embodiment of the method for manufacturing the probe unit 1 according to the first embodiment of the probe unit of the present invention. The similar parts as in the first embodiment are marked with the same reference numbers as in the first embodiment and their explanation will be omitted.

First, a hollow part 200 in a shape of a groove is formed on the substrate 2 made of ceramic as shown in FIG. 14A1. The substrate 2 may be formed of non-organic material such as glass ceramic, glass, silicon, metal, etc., or resin. The hollow part may be formed by removing a part of the substrate in a shape of a plate by a cutting process or may be formed by forming the substrate 2 having the hollow part 200.

Next, a sacrificial layer 204 is formed of Cu for filling up the hollow 200 as shown in FIG. 14A1. The sacrificial layer 204 may be formed of material other than Cu if the material can be removed in the later-described removing process for removing the sacrificial layer 204.

Figure 3A:
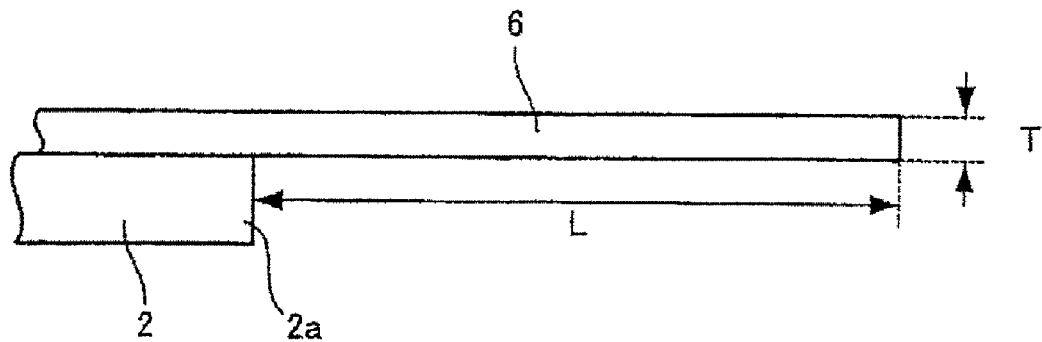
FIG. 3A is a side view showing a first layer of the probe according to the first embodiment of the probe unit of the present invention.
Figure 3B:
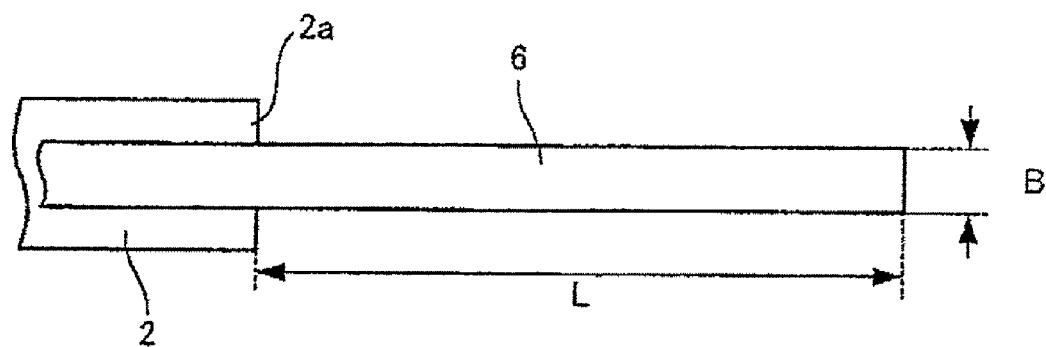
FIG. 3B is a plan view.

Next, on the substrate 2 and the sacrificial layer 204, first layers 6, each of which is in a shape of long bar (or stick), are formed in a direction crossing a longitudinal direction of the hollow part 200 to position one end 6a of each first layer 6 on the sacrificial layer 204. For example, a first seed layer 206 is formed on the substrate 2 and the sacrificial layer 204 by a sputter, and a first resist layer 208 exposing regions where the first layers 6 will be formed is formed on the seed layer 206 as shown in FIG. 14A2. Thereafter, the first layers 6 are formed as shown in FIG. 14A3 by plating NiFe on the seed layer 206 exposing through the first resist layer 208. The first resist layer 208 is formed by arranging a mask with a predetermined shape to a resist film formed by applying photo resist on the first resist layer 206 and removing unnecessary resist film after a development process. The first layer 6 may be formed of Ni, NiCo, NiMn, etc. and may be formed not only by plating. When the first layer 6 is formed by a process other than the plating, the first seed layer 206 may not be formed. Hereinafter, all the seed layer will be formed by the similar process for forming the first seed layer 208, and all the resist layers are formed by the similar process for forming the first resist layer 208.

Figure 4:
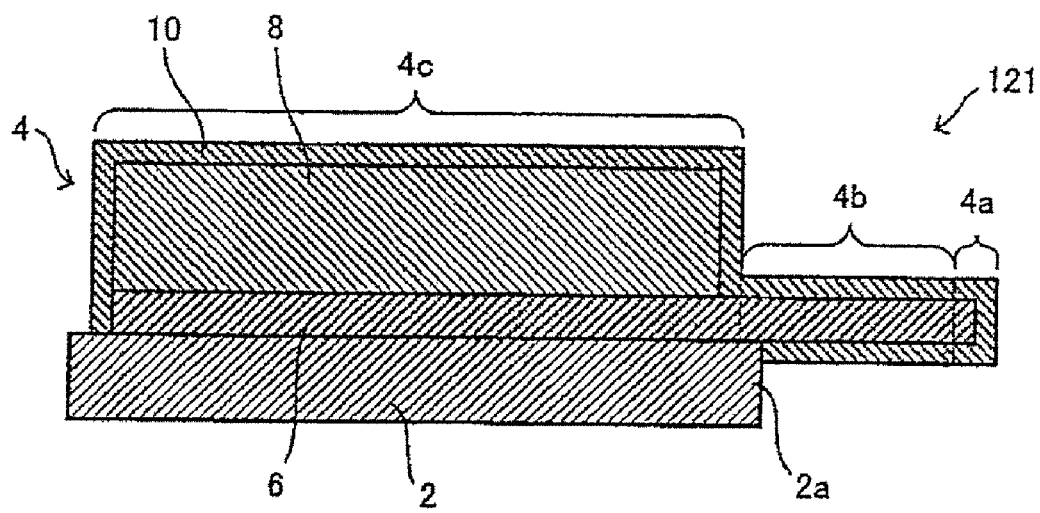
FIG. 4 is a schematic diagram of the probe of a probe unit according to the first embodiment of the probe unit of the present invention.

Next, the second layers 8 will be formed on the first layers 6. For example, the second layer 8 is formed as shown in FIG. 14A4 by plating Cu on the first layers 6 exposing from the first resist layer 208. The second layers 8 may be formed of Ni, Ni alloy, Au, Al, etc. and may be formed not only by plating.

Figure 5:
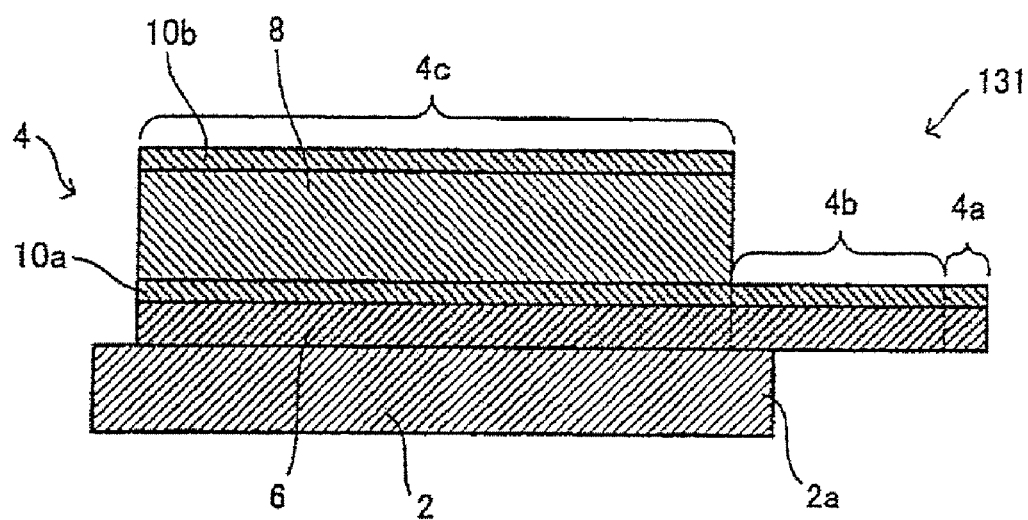
FIG. 5 is a schematic diagram of the probe of the probe unit according to the first embodiment of the probe unit of the present invention.
Figure 6:
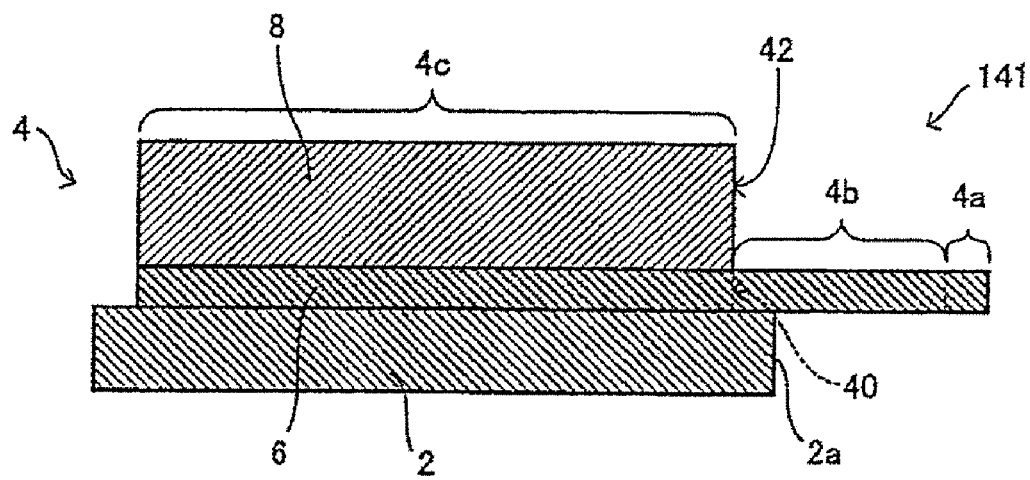
FIG. 6 is a schematic diagram of the probe of the probe unit according to the first embodiment of the probe unit of the present invention.

Thereafter, a part of the second layer from one end 8a on the sacrificial layer 204 to a predetermined point on the substrate 2 is removed. For example, a second resist layer exposing the part of the second layer from one end 8a on the sacrificial layer 204 to a predetermined point on the substrate 2 is formed on the first layer 6 as shown in FIG. 14A5, and the second layer 8 exposing through the second resist layer 210 is removed by etching or the like as shown in FIG. 14A6.

Then, the first resist layer 208 and the second resist layer 210 are removed, and the first seed layer 206 exposing on the sacrificial layer 204 side through the first layers 6 by milling or the like as shown in FIG. 14A7. In order to remove the first resist layer 208 and the second resist layer 210, chemical such as N-Methyl-2-pyrrolidone, etc. Hereinafter, all the resist layers are removed the similar process as for removing the first resist layer 208 and the second resist layer 210.

Figure 8:
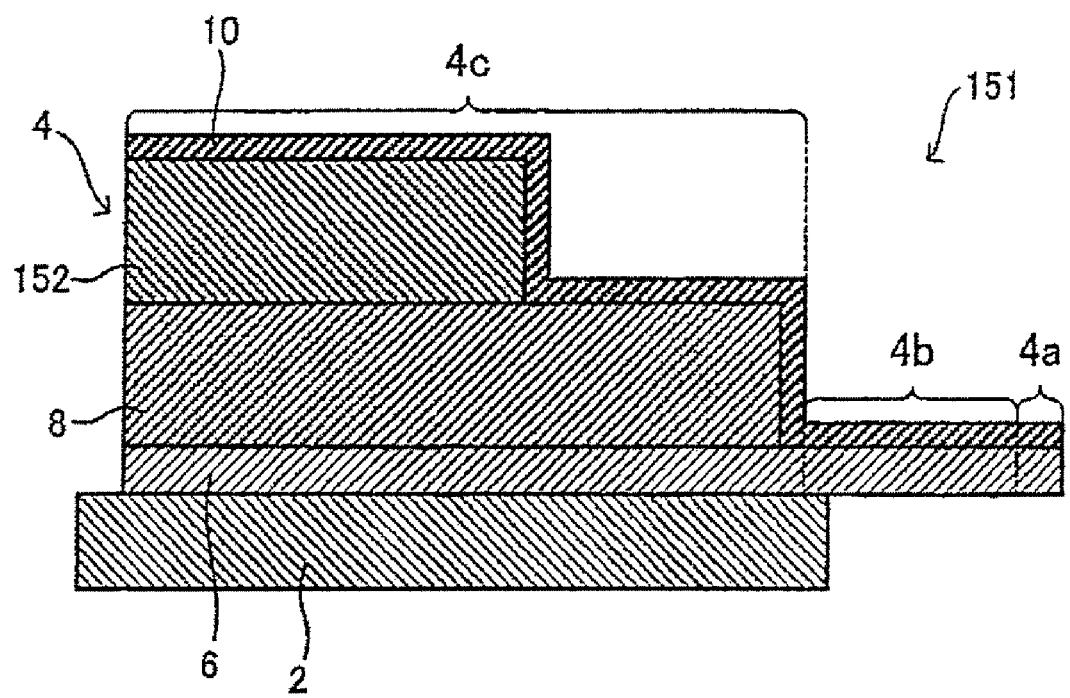
FIG. 8 is a schematic diagram of the probe of the probe unit according to the first embodiment of the probe unit of the present invention.

Next, the surface layers 10 will be formed on the first layers 6 and on the second layers 8. The thickness of the surface layer 10 is preferably in a range from about 0.01 □m to about 10 □m. For example, the third resist layer 212 is formed on a part of the substrate 2 and the sacrificial layer 204 where the first layers 6 are not formed as shown in FIG. 15A8, and the surface layers 10 are formed by plating Au on the first layers 6 and the second layer 8 exposing through the third resist layer 212 as shown in FIG. 15A9. Thereafter, the third resist layer 212 is removed. The surface layers 10 may be formed of Au alloy, Pd, Rh, Ir, etc. and may be formed not only by plating.

Next, the sacrificial layer 204 will be removed. For example, a protection film 214 covering the second layers 8 is formed as shown FIG. 15A10, the sacrificial layer 204 is removed by wet-etching or the like as shown in FIG. 15A11, and then the protection film 214 is removed. The protection film 214 is a film for protecting the second layers 8 not to be removed together with the sacrificial layer 204 when the sacrificial layer 204 is removed. Therefore, the protection film 214 is formed of material not to be removed with the sacrificial layer 204. When the second layer 8 and the sacrificial layer 204 are formed of the same material such as Cu, the protection film 214 must be formed as described in the above; however, when the second layer 8 and the sacrificial layer 204 are formed of different materials that can be selectively removed, the protection film 214 will be unnecessary.

Figure 12:
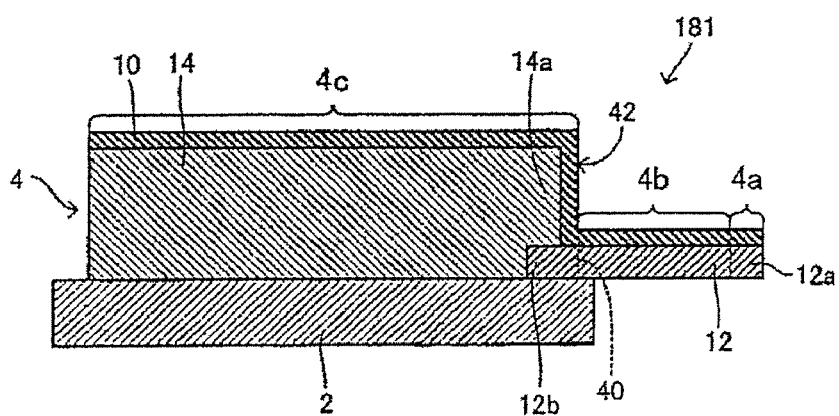
FIG. 12 is a schematic diagram of the probe of the probe unit according to the third embodiment of the probe unit of the present invention.
Figure 13:
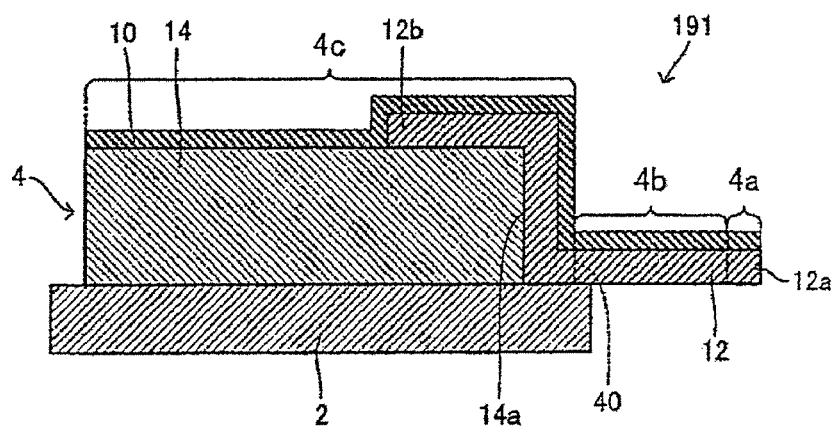
FIG. 13 is a schematic diagram of the probe of the probe unit according to the third embodiment of the probe unit of the present invention.

Finally, the substrate 2 and the first seed layer 206 are cut by dicing into chips (probe units) as shown in FIG. 15A12. Further, the substrate 2 and the first seed layer 206 may be cut by processes other than the dicing.

FIG. 16 are schematic diagrams for explaining a manufacturing method according to a second embodiment of the method for manufacturing the probe unit 1 according to the first embodiment of the probe unit of the present invention. The similar parts as in the first embodiment of the probe unit and the first embodiment of the method are marked with the same reference numbers as in the first embodiments and their explanation will be omitted.

First, a fourth resist layer 216 exposing regions where the second layers 8 are formed is formed on the first layers 6 (FIG. 14A3) as shown in FIG. 16A1. For example, the fourth resist layer 216 is formed from one end 6a above the sacrificial layer 204 to a predetermined position above the substrate 2 on the first layers 6.

Next, the second layers 8 are formed by plating Cu on the first layers 6 exposing through the fourth resist layer 216 as shown in FIG. 16A2.

Then, the first resist layer 208 and the fourth resist layer 216 are removed, and the first seed layer 206 exposing through the first layer 6 on the sacrificial layer 204 side as shown in FIG. 16A3. Thereafter, the similar processes as in the above-described first embodiment of the method are executed as in FIG. 15.

By the above-described first and second methods of the manufacturing the probe unit, each of the first layers 6 of which one end 6a is positioned on the sacrificial layer 204 is formed on the sacrificial layer 204 and the substrate 2, and the sacrificial layer 204 is removed thereafter; therefore, each of the one end 6a of the first layer 6 is projecting to the hollow part 200 of the substrate 2.

Moreover, the part from the one end 8a of each second layer 8 on the sacrificial layer 204 to the predetermined position on the substrate 2 is removed, or the second layers 8 are formed by masking areas of the first layers 6 from the one ends 6a to the predetermined position on the substrate 2 with the fourth resist layer 216; therefore, the second layer 8 is not formed at least on each one end 6a of the first layer 6, whereas the second layer 2 is formed on a part of each first layer 6 from the predetermined position of the substrate 2 to the another end of the first layer 6.

Furthermore, the surface layer 10 is formed on each of the first layers 6 and the second layers 8 exposing through the third resist layer 212 formed on the region of the substrate 2 and the sacrificial layer 204 where the first layers 6 are not formed; therefore, the surface layer 10 can be formed on each of the first layers 6 and the second layers 8 as in the probe unit 1 according to the first embodiment of the probe unit of the present invention.

FIG. 17 are schematic diagrams for explaining a manufacturing method according to a third embodiment of the method for manufacturing the probe unit 121. The difference between the first and the third embodiments of the method is in the forming process of the surface layers 10. The similar parts as in the above-described embodiments are marked with the same reference numbers as in the embodiments and their explanation will be omitted.

First, the seed layer 206, the first layers 6 and the second layers 8 are formed on the substrate 2, and the first resist layer 208, etc. are removed as same as the above described first and the second embodiments of the method (refer to FIG. 14A7 and FIG. 16A3).

Next, the sacrificial layer 204 is removed. For example, the protection film 214 covering the second layers 8 is formed as shown in FIG. 17A1, and the sacrificial layer 204 is removed by the wet-etching or the like as shown in FIG. 17A2. Then the protection film 214 is removed as shown in FIG. 17A3.

Next, the surface layers 10, each covering the surfaces of the first layer 6 and the second layer 8, are formed as shown in FIG. 17A4. For example, Au is plated by turning on electricity to the region of the seed layer 206 where the first layers 6 are not formed. The surface layer 10 may be formed by other process than the plating. Further, the region turned on electricity can be not only on the first layer 6 but also on the second layer 8.

Finally, the substrate 2, the first seed layer 206 and the surface layers 10 are cut by dicing into chips (probe units) as in the first embodiment of the method (refer to FIG. 17A5).

By forming the surface layers 10 as described in the above, the probe unit 121 according to the third embodiment of the probe unit having the surface layers 10 covering the surfaces of the first layers 6 and the second layers 8 can be manufactured.

A fourth and a fifth embodiments of the method for manufacturing the probe unit will be described. The difference between the first to the third embodiments of the method and the fourth and the fifth embodiments of the method is in the forming process of the surface layers 10. The similar parts as in the above-described embodiments are marked with the same reference numbers as in the embodiments and their explanation will be omitted.

FIG. 18 are schematic diagrams for explaining a manufacturing method according to the fourth embodiment of the method for manufacturing the probe unit 131.

First, first surface layers 10a are formed as shown in FIG. 18A1 on the first layers 6 by the similar process as in the first embodiment of the method as shown in FIG. 14A3. The first surface layers 10a are formed by the same process and of the same material as in the surface layers 10. For example, the first surface layers 10a are formed by plating Au on the first layers 6 exposing through the first resist layer 208.

Next, the second layers 8 are formed on the first surface layers 10a. Then, second surface layers 10b are formed on the second layers 8. The second surface layers 10b are formed by the same process and of the same material as in the surface layers 10.

Then, the second resist layer 210 is formed on the second surface layers 10b by the similar process as in the first embodiment of the method, and parts of the second surface layers 10b and the parts of the second layers 8 exposing through the second resist layer 210 are removed by the etching or the like as shown in FIG. 18A3. The processes after that are the same as in the above-described embodiments of the method (refer to FIG. 15 and FIG. 17).

FIG. 19 are schematic diagrams for explaining a manufacturing method according to the fifth embodiment of the method for manufacturing the probe unit 131.

First, first surface layers 10a are formed as shown in FIG. 19A1 on the first layers 6 by the similar process as in the first embodiment of the method as shown in FIG. 14A3. For example, the first surface layers 11a are formed on the first layers 6 exposing through the first resist layer 208.

Next, the second layers 8 are formed on the first surface layers 10a. For example, the fourth resist layer 216 is formed on the first surface layers 10a as shown in FIG. 19A1 by the similar process as in the second embodiment of the method, and the second layers 8 are formed on the first surface layers 10a exposing through the fourth resist layer 216 as shown in FIG. 19A2.

Then, second surface layers 10b are formed on the second layers 8. For example, the second surface layers 10b are formed on the second layers 8 exposing through the fourth resist layer 216.

Next, the first resist layer 208 and the fourth resist layer 216 are removed, and the first seed layer 206 exposing from the first layers 6 on the sacrificial layer 204 is removed as shown in FIG. 19A3. The processes after that are the same as in the above-described embodiments of the method (refer to FIG. 15 and FIG. 17).

FIG. 20 are schematic diagrams for explaining a manufacturing method according to a sixth embodiment of the method for manufacturing the probe unit 171. The similar parts as in the above-described embodiments are marked with the same reference numbers as in the embodiments and their explanation will be omitted.

First, as same as the first embodiment of the method, the sacrificial layer 204 is formed on the substrate 2 as shown in FIG. 14A1.

Next, on the substrate 2 and the sacrificial layer 204, thin layers 12, each of which is in a shape of long bar (or stick), are formed in a direction crossing a longitudinal direction of the hollow part 200 to position one end 12a of each thin layer 12 on the sacrificial layer 204. For example, the first seed layer 206 is formed on the substrate 2 and the sacrificial layer 204, and a fifth resist layer 218 exposing regions where the thin layers 12 will be formed is formed in a bar shape on the first seed layer 206 as shown in FIG. 20A1. Then the thin layers 12 are formed by plating NiFe on the first seed layer 206 exposing through the fifth resist layer 218 as shown in FIG. 20A2. The thin layers 12 may be formed of Ni alloy such as NiCo, NiMn, etc. or Ni.

Next, thick layers 14, each of which is connected with each of the thin layers 12 at another end 12b and having the same width as the thin layer 12, is formed in a shape of a bar. For example, a sixth resist layer 220 exposing regions where the thick layers 14 will be formed is formed in a bar shape on the first seed layer 206 as shown in FIG. 20A3. The sixth resist layer 220 is burying the thin layers 12 in a condition that the surfaces of the another ends 12 are exposed. Then by plating Cu on the first seed layer 206 exposing through the sixth resist layer 220, the thick layers 14 are formed as shown in FIG. 20A4. The thick layers 14 are preferably formed to be thicker than the thin layers 12. The material for the thick layers 14 is not limited to Cu. The material for the thick layers 14 may be NiFe as same as the thin layers 12, Ni alloy such as NiCo, NiMn, etc., or Ni, Au, Al, etc. Further, the thin layers 12 and the thick layers 14 can be formed by a process other than the plating. When they are formed by the process other than the plating, the first seed layer 206 may not be formed.

Next, the sixth resist layer 220 is removed, and the first seed layer 206 exposing from the thin layers 12 on the sacrificial layer 204 side is removed by milling or the like as shown in FIG. 20A5. The processes after that are the same as in the above-described embodiments of the method (refer to FIG. 15 and FIG. 17).

FIG. 21 are schematic diagrams for explaining a manufacturing method according to a seventh embodiment of the method for manufacturing the probe unit 191. The difference from the sixth embodiment of the method is in the forming processes of the thin layers 12 and the thick layers 14. The similar parts as in the above-described embodiments are marked with the same reference numbers as in the embodiments and their explanation will be omitted.

First, as same as the first embodiment of the method, the sacrificial layer 204 is formed on the substrate 2 as shown in FIG. 14A1.

Next, on the substrate 2, thick layers 14, each of which is in a shape of long bar (or stick), are formed in a direction crossing a longitudinal direction of the hollow part 200. For example, the first seed layer 206 is formed on the substrate 2 and the sacrificial layer 204, and a seventh resist layer 222 exposing regions where the thick layers 14 will be formed is formed in a bar shape on the first seed layer 206 as shown in FIG. 21A1. Then the thick layers 14 are formed by plating Cu on the first seed layer 206 exposing through the seventh resist layer 222 as shown in FIG. 21A2. Thereafter, the seventh resist layer 222 is removed.

Next, bar-shaped thin layers 12, of which thicknesses are thinner than those of the thick layers 14 but widths are the same as those of the thick layers 14, are formed. One end 12a of each thin layer 12 is formed on the sacrificial layer 204, and another end 12b of each thin layer 12 is formed on a part of the one edge 14a of the thick layer 14. For example, an eighth resist layer 224 exposing regions where the thin layers 12 are formed in a bar-shape and burying the thick layers 14 excepting parts of the one ends 14a is formed as shown in FIG. 21A3. Then the thin layers 12 are formed on the first seed layer 206 and the thick layers 14 exposing through the eighth resist layer 224 as shown in FIG. 21A4.

Next, the eighth resist layer 224 is removed, and the first seed layer 206 exposing from the thin layers 12 on the sacrificial layer 204 is removed by milling or the like as shown in FIG. 21A5. The processes after that are the same as in the above-described embodiments of the method (refer to FIG. 15 and FIG. 17).

In the above-described sixth and the seventh embodiment of the method, the thin layers 12 of which one ends 12a are positioned on the sacrificial layer 204 are formed on the substrate 2 and the sacrificial layer 204, and the sacrificial layer 204 is removed, so that the one ends 12a of the thin layers 12 are projecting to the hollow part 200 of the substrate 2. Moreover, the probe unit has the thin layers 12 and the thick layers 14; therefore, the probe unit 171 or the probe unit 191 having the thick layers 14 formed thicker than the thin layers 12 can be manufactured.

Although in the sixth embodiment of the method the sixth resist layer 220 for burying the thin layers 12 is formed in that condition that the another ends 12 b of the thin layers 12 are exposed, the sixth resist layer 220 exposing a part of the another ends of the thin layers 12 may be formed as shown in FIG. 2. 22 so that the probe unit 181 wherein the part of another ends of the thin layers 12 are buried in the one ends 14a of the thick layers 14 can be formed.

FIG. 23 are schematic diagrams for explaining a manufacturing method according to an eighth embodiment of the method for manufacturing the probe unit 111. The similar parts as in the above-described embodiments are marked with the same reference numbers as in the embodiments and their explanation will be omitted.

First, as same as the first embodiment of the method, the first seed layer 206 is formed on the substrate 2, and the ninth resist layer 228 exposing regions where the second layers 8 will be formed is formed in a bar shape on the first seed layer 206 as shown in FIG. 23A1. Then the second layers 8 are formed on the first seed layer 206 exposing through the ninth resist layer 228 as shown in FIG. 23A2. Thereafter, the ninth resist layer 228 is removed.

Then the first seed layer 206 exposing from the second layers 8 on the sacrificial layer 204 is removed as shown in FIG. 23A3.

Next, a tenth resist layer 230 burying the second layers 8 is formed, and the upper surfaces of the second layers 8 and the tenth resist layers 230 are planarized by polishing or the like as shown in FIG. 23A4. The planarization of the upper surfaces of the second layers 8 and the tenth resist layers 230 is not limited to the polishing. Further, if the upper surfaces of the second layers 8 and the tenth resist layers 230 are formed to be enough planarized for the manufacturing processes, the polishing may be omitted.

Next, on the second layers 8, the first layers 6, each of which is in a shape of long bar (or stick), are formed in a direction crossing a longitudinal direction of the hollow part 200. The first layers 6 are formed to position their one ends 6a are projecting from the one ends 8a of the second layers 8 and on the sacrificial layer 204. For example, a second seed layer 234 is formed on the second layers 8 and the tenth resist layer 230 by the sputtering or the like, and an eleventh resist layer exposing the regions where the first layers 6 will be formed in a bar-shape is formed as shown in FIG. 23A5. Then, the first layers 6 are formed on the second seed layer 234 exposing through the eleventh resist layer 236 as shown in FIG. 23A6. Thereafter, the eleventh resist layer 236 is removed.

Next, the second seed layer 234 exposing through the first layers 6 are removed as shown in FIG. 23A7, and then the tenth resist layer 230 is removed as shown in FIG. 23A8. The processes after that are the same as in the above-described embodiments of the method (refer to FIG. 15 and FIG. 17).

In the above-described eighth embodiment of the method, the one ends 6a of the first layers 6 are formed above the hollow part 200 via the sacrificial layer 204 and the tenth resist layer 230, and the sacrificial layer 204 and the tenth resist layer 230 are removed thereafter; therefore, the first layers 6 formed on the second layers 8 are projecting to the hollow part 200. That is, the probe unit 111 can be manufactured.

The present invention has been described in connection with the preferred embodiments. The invention is not limited only to the above embodiments. It is apparent that various modifications, improvements, combinations, and the like can be made by those skilled in the art.

What is claimed is:

1. A method for manufacturing a probe unit, comprising the steps of:
   (a) preparing a substrate;
   (b) forming a hollow part in the substrate;
   (c) forming a sacrificial layer that buries the hollow part on the substrate;
   (d) forming a first layer on the substrate, wherein one end of the first layer is positioned on the sacrificial layer, step (d) comprising the steps of:
      (d1) forming a first resist layer on the substrate and the sacrificial layer with exposing a part on which the first layer is formed;
      (d2) forming the first layer on the part exposing from the first resist layer; and
      (d3) removing the first resist layer;
   (e) forming a second layer on the first layer at least excepting the one end, the second layer being formed using a second resist layer, the second resist layer being removed upon completion of the second layer; and
   (f) removing the sacrificial layer.

2. The method for manufacturing a probe unit according to claim 1, further comprising the step of (g) forming a surface layer on the first layer and the second layer after the step (e).

3. The method for manufacturing a probe unit according to claim 1, wherein the sacrificial layer is made of a metal layer.

4. A method for manufacturing a probe unit, comprising the steps of:
   (a) preparing a substrate;
   (b) forming a hollow part in the substrate;
   (c) forming a sacrificial layer that buries the hollow part on the substrate;
   (d) forming a first layer on the substrate, wherein one end of the first layer is positioned on the sacrificial layer, step (d) comprising the steps of:
      (d1) forming a first resist layer on the substrate and the sacrificial layer with exposing a part on which the first layer is formed;
      (d2) forming the first layer on the part exposing from the first resist layer; and
      (d3) removing the first resist layer;
   (e) forming a second layer on the first layer at least excepting the one end, wherein the step (e) comprises the steps of:
      (e1) forming the second layer on the first layer;
      (e2) forming a second resist layer on the second layer with a part exposing the second layer;
      (e3) removing the second layer exposing from the second resist layer; and
      (e4) removing the second resist layer; and
   (f) removing the sacrificial layer.

5. A method for manufacturing a probe unit comprising the steps of:
   (a) preparing a substrate;
   (b) forming a hollow part in the substrate;

(c) forming a sacrificial layer that buries the hollow part on the substrate;
(d) forming a first layer on the substrate, wherein one end of the first layer is positioned on the sacrificial layer, step (d) comprising the steps of:
  (d1) forming a first resist layer on the substrate and the sacrificial layer with exposing a part on which the first layer is formed;
  (d2) forming the first layer on the part exposing from the first resist layer; and
  (d3) removing the first resist layer;
(e) forming a second layer on the first layer at least excepting the one end, wherein the step (e) comprises the steps of;
  (e1) forming a second resist layer on the first layer with exposing a part on which the second layer is formed;
  (e2) forming the second layer on the part exposing from the second resist layer;
  (e3) removing the second resist layer; and
(f) removing the sacrificial layer.

* * * * *

UNITED STATES PATENT AND TRADEMARK OFFICE
CERTIFICATE OF CORRECTION

PATENT NO.        : 7,559,139 B2
APPLICATION NO.   : 11/970704
DATED             : July 14, 2009
INVENTOR(S)       : Masahiro Sugiura et al.

It is certified that error appears in the above-identified patent and that said Letters Patent is hereby corrected as shown below:

On the title page, item:

(73) Assignee: Please delete "Yamaha Corporation, Shizuoka-Ken (JP)" and insert
--Yamaichi Electronics Co., Ltd., Tokyo (JP)--

Signed and Sealed this

Twentieth Day of April, 2010

David J. Kappos
*Director of the United States Patent and Trademark Office*